United States Patent
Lim

[11] 4,002,512
[45] Jan. 11, 1977

[54] METHOD OF FORMING SILICON DIOXIDE

[75] Inventor: Mahn-Jick Lim, Lower Makefield Township, Bucks County, Pa.

[73] Assignee: Western Electric Company, Inc., New York, N.Y.

[22] Filed: Apr. 14, 1975

[21] Appl. No.: 568,215

Related U.S. Application Data

[63] Continuation-in-part of Ser. No. 506,622, Sept. 16, 1974, abandoned.

[52] U.S. Cl. .................. 148/187; 65/3 A; 148/174; 427/93; 350/96 WG
[51] Int. Cl.² ............................ H01L 21/18
[58] Field of Search ............ 65/3; 106/52; 148/174, 148/187; 427/93

[56] References Cited
UNITED STATES PATENTS

| | | | |
|---|---|---|---|
| 3,117,838 | 1/1964 | Sterling et al. | 23/182 |
| 3,212,922 | 10/1965 | Sirtl | 117/106 |
| 3,331,716 | 7/1967 | Bloem et al. | 148/174 |
| 3,404,451 | 10/1968 | So | 148/187 X |
| 3,459,673 | 8/1969 | Best et al. | 252/301.4 |
| 3,642,521 | 2/1972 | Moltzan et al. | 117/105.2 |
| 3,659,915 | 5/1972 | Maurer et al. | 350/9 WG |
| 3,669,693 | 6/1972 | Dalton et al. | 117/201 |
| 3,737,292 | 6/1973 | Keck et al. | 65/3 |
| 3,737,293 | 6/1973 | Maurer | 65/3 |
| 3,782,914 | 1/1974 | DeLuca et al. | 65/3 |
| R28,028 | 6/1974 | Maurer | 65/3 |
| R28,029 | 6/1974 | Keck et al. | 65/3 |

OTHER PUBLICATIONS

Steinmeyer et al., "Successive Growth of Si and $SiO_2$ — etc.", J. Electrochem. Soc., Feb. 1964, vol. III, No. 2, pp. 206–209.
Tung et al., "The Deposition of Oxide on Silicon — etc.", Trans. of Met. Soc. of AIME, vol. 233, Mar. 1965, pp. 572–577.
Chu et al., "Silica Films by the Oxidation of Silane", Trans. of Met. Soc. of AIME, vol. 242, Mar. 1968, pp. 532–538.

*Primary Examiner*—L. Dewayne Rutledge
*Assistant Examiner*—J. M. Davis
*Attorney, Agent, or Firm*—J. Rosenstock

[57] ABSTRACT

A method of depositing a layer comprising $SiO_2$ on a surface of a substrate at a rate which is temperature independent is disclosed. The method includes combining dichlorosilane ($SiH_2Cl_2$) with an oxidizing gas, such as $O_2$, $CO_2$, $N_2O$, $H_2O$, to form $SiO_2$.

23 Claims, 18 Drawing Figures

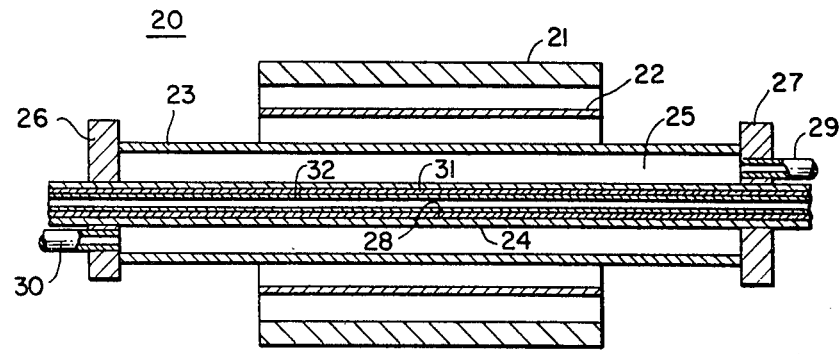
FIG. 1
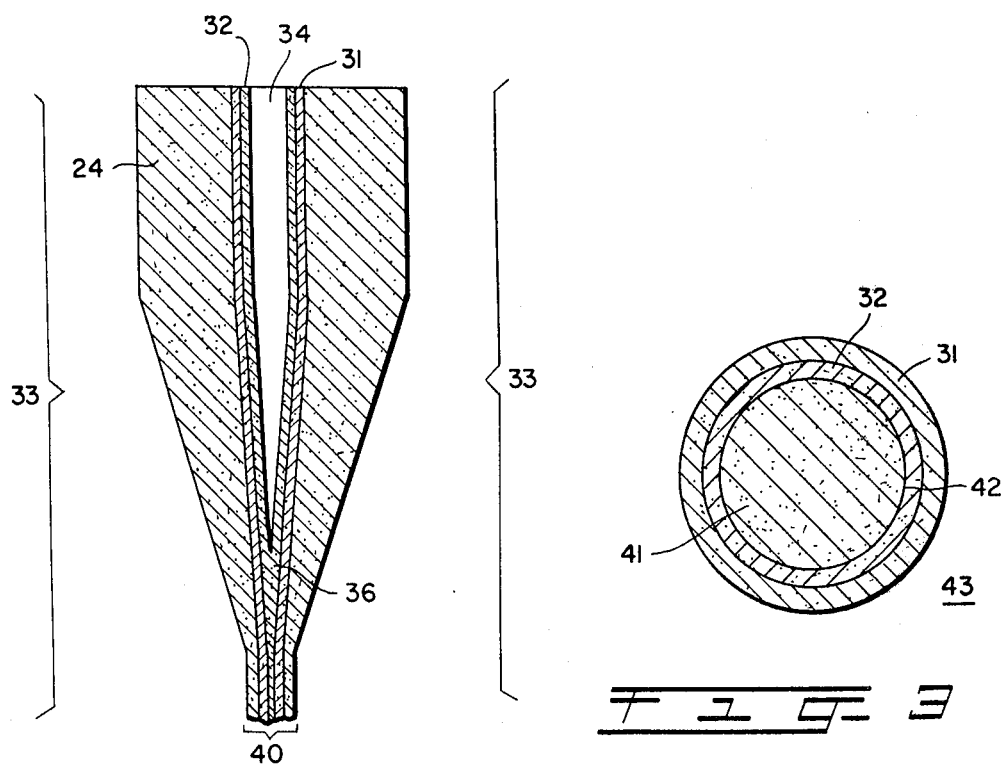
FIG. 2
FIG. 3

– PRIOR ART –

DEPOSITION RATE OF SILICA FILMS BY THE OXIDATION OF SILANE IN VARIOUS DILUENTS. FLOW RATE OF DILUENT = 20 LITERS PER MIN. FLOW RATE OF $SiH_4$ = 4 ML PER MIN. AND FLOW RATE OF $O_2$ = 100 Ml PER MIN.

– PRIOR ART –

GROWTH RATE OF $SiO_2$ vs SUBSTRATE TEMPERATURE (1% $SiCl_4$) 8% $CO_2$, FLOW RATE 1 LITER/MIN.)

– PRIOR ART –

METHOD OF FORMING SILICON DIOXIDE

This is a continuation-in-part application of my co-pending application Ser. No. 506,622, filed on Sept. 16, 1974, now abandoned, and assigned to the assignee hereof.

BACKGROUND OF THE INVENTION

1. Field of the Invention

This invention relates to a method of forming silicon dioxide and more particularly, to a method including reacting dichlorosilane with a gaseous oxidant to form silicon dioxide.

2. Description of the Prior Art

Waveguides used in optical communications systems referred to as "optical waveguides," are normally constructed from a transparent dielectric material such as glass or plastic.

It is well known to one skilled in the art that light can be caused to propagate along a transparent fiber structure which has a higher refractive index than its surroundings. The ordinary use of such optical fibers is to trasmit a signal or an image, that is light which has been modulated from one point to another. Optical fibers produced for these purposes must avoid excessive attenuation of the transmitted light to be effective. Also, to be an effective transmitting medium for an optical communications system, an optical waveguide should not only transmit light without excessive attenuation, but should be constructed to minimize cross-talk from adjacent waveguides. In addition, such an optical waveguide should not cause dispersion of the transmitted light and should propagate preselected modes of light.

Producing a satisfactory optical waveguide has been one of the more difficult problems in the development of an effective optical communications system.

A method heretofore used for producing an optical fiber is described as follows: A silica tube is selected and maintained at an elevated temperature of about 1100°–1200° C. Dry oxygen is bubbled through a tank containing liquid silicon tetrachloride, $SiCl_4$, at a temperature of approximately 35° C. $SiCl_4$ vapors picked up by the oxygen are then directed through the silica tube where at the inside wall there is a reaction between the oxygen and the $SiCl_4$ resulting in the formation of very pure $SiO_2$ which is deposited on the inside wall of the silica tube in the form of a first $SiO_2$ layer. A second layer comprising $SiO_2$ suitably doped, e.g., with titanium, is deposited on the first layer employing chemical vapor deposition as described except the oxygen is bubbled through a mixture of $SiCl_4$ and a dopant, e.g., $TiCl_4$. The resultant laminar structure is then drawn until the tube collapses and is fused together to form an optical fiber preform. In this method, the reaction of $SiCl_4$ and $O_2$ (as well as with $H_2O$, $N_2O$, $CO_2$ and other gaseous oxidants) is very temperature dependent and variations in reaction temperature lead to irregularities in the thickness and in the uniformity of the resultant $SiO_2$ layers.

U.S. Pat. No. 3,459,673 reveals a method of producing a doped luminescent silica glass where silica is formed in a process including reacting a hydrolyzable silicon compound, such as $SiH_2Cl_2$, with water. U.S. Pat. No. 3,459,673 however does not reveal a method of depositing a uniform $SiO_2$ layer on a substrate surface at a rate which is temperature independent and therefore relatively unaffected by temperature gradients.

Accordingly, a method of forming a relatively defect free $SiO_2$ preform which is relatively rapid and which can be carried out at wide temperature ranges including relatively lower temperatures and which is relatively temperature insensitive is an object of the subject invention.

In the manufacturing of planar semiconductor devices, the entire surface of the wafer or body of the semiconductor material is coated with an insulating or masking layer, which is normally a layer of silicon dioxide. By means of photolithographic techniques including coating the surface of the insulating layer with a uniform layer of photoresist, exposing the same to a desired pattern on a photolightographic mask, and subsequent chemical etching, selected portions of the insulating layer are removed to expose the surface of the semiconductor body. A desired P-N junction may then be formed in the semiconductor body by ion implantation techniques or by predepositing the desired impurity material on the exposed surface of the body and then diffusing the impurity into the body by well known solid state diffusion techniques. The diffusion of the impurity material is normally carried out under such conditions that a layer of oxide is regrown over the previously exposed surface of the semiconductor body resulting in a continuous oxide layer across the entire surface. Additional junctions, for example in the case of double diffused transistor devices, may be formed in the wafer by selectively removing a portion of the regrown oxide layer by photolithographic techniques to expose the surface of the semiconductor body and then predepositing and diffusing the desired impurity into the body again under conditions whereby the oxide layer is regrown over the exposed portion. Electrical contacts to the various P-N junctions are then provided by once again selectively removing portions of the oxide to expose the surface of the wafer thereunder, evaporating a metal film over the entire surface of the oxide and selectively removing portions of the film by photoengraving techniques.

The masking silicon dioxide layer has been thermally grown by oxidation of silicon which is normally performed at relatively high temperatures, above 900° C and usually from 1100° C to 1200° C. Thermally forming the oxide at such temperatures, i.e., above 900° C, can cause a shift of the P-N junction boundaries during the oxidation of silicon as well as creating dislocation and stacking faults within the semiconductor body itself. Thermally grown oxides resulting from temperatures below 900° C are formed at a very low rate and therefore require long periods of time thereby making such a process uneconomical for semiconductor device manufacture.

Other techniques for forming silicon dioxide films include gaseous oxidation of $SiCl_4$ or $SiH_4$. These techniques involve undesirably high temperatures, e.g., around 1100°–1200° C, which again can cause a shift of the P-N junction boundaries during their formation as well as creating dislocation and stacking faults within the silicon body itself. Low temperature (below 900° C) gaseous oxidation of $SiH_4$ or $SiCl_4$ results in silicon oxide films which are very porous and which can easily be dissolved or etched. Furthermore, the deposition rate with silica is very slow. For planar semiconductor device fabrication, a dense silicon oxide film is desired as well as one which has a low dissolution or etch rate.

A relatively low temperature technique of forming a uniform, relatively non-porous silicon dioxide film on a surface of a semiconductor body which does not introduce additional defects into the semiconductor body is desired.

SUMMARY OF THE INVENTION

This invention relates to a method of forming silicon dioxide and more particularly, to a method including reacting dichlorosilane with a gaseous oxidant to form silicon dioxide.

The method includes combining dichlorosilane ($SiH_2Cl_2$) and an oxidizing gas at a suitable temperature to form the $SiO_2$.

DESCRIPTION OF THE DRAWING

The present invention will be more readily understood by reference to the following drawing taken in conjunction with the detailed description, wherein:

FIG. 1 is a cross-sectional view of a typical gaseous growth apparatus adapted for fabricating a silica optical fiber preform;

FIG. 2 is a cross-sectional view of a fiber optic preform which is being drawn;

FIG. 3 is a cross-sectional view of a $SiO_2$ rod which has been chemically vapor-phase deposited with two $SiO_2$ containing layers;

DETAILED DESCRIPTION

Figure 10:
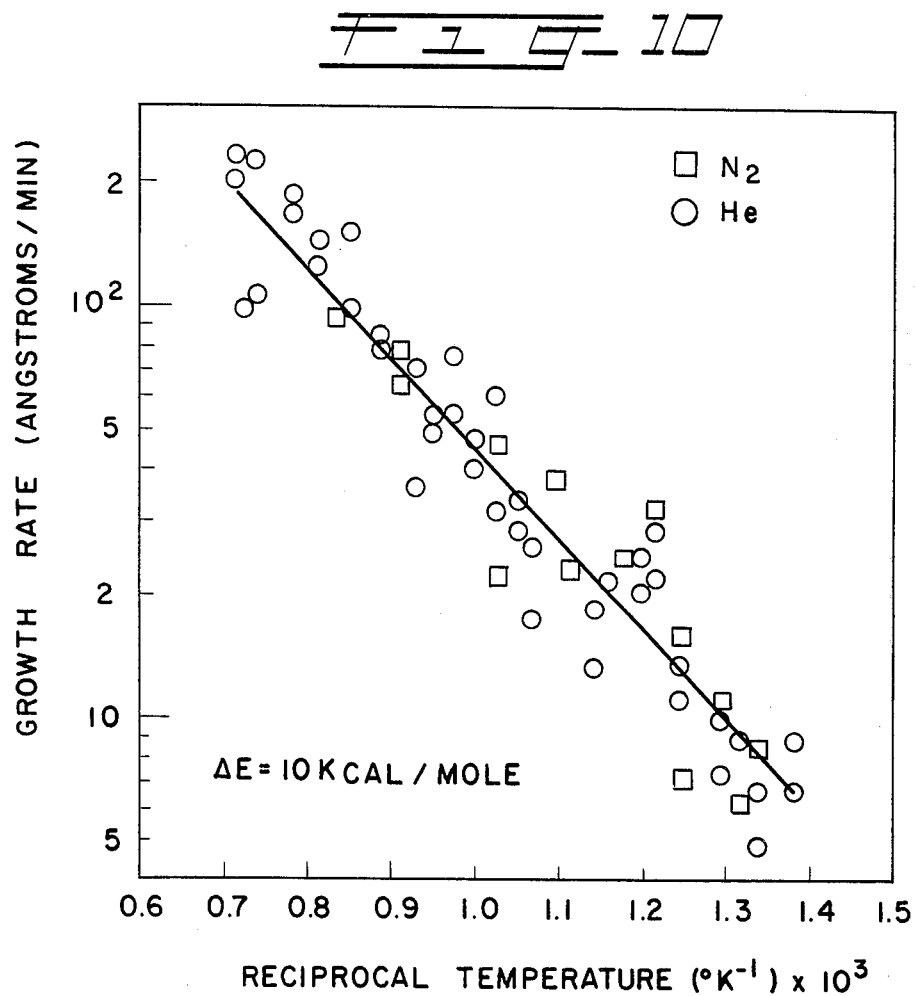
FIG. 10 is a graphical representation of the rate of growth of $SiO_2$ on a (100) silicon surface with temperature resulting from reacting $SiH_2Cl_2$ and $O_2$.

The present invention has been described largely in terms of forming pure $SiO_2$ and $SiO_2$ doped with germanium and boron. The present invention has also been described largely in terms of forming and depositing a $SiO_2$ film on a semiconductor surface comprising silicon. However, it will be understood that such description is for purposes of exposition and not for purposes of limitation. It will be readily appreciated that the inventive concept described is equally applicable to forming $SiO_2$ doped with other suitable dopants which alter the index of refraction of the $SiO_2$, such as for example titanium, tantalum, tin, niobium, zirconium, aluminum and lanthanum. It will also be readily appreciated that the inventive concept described is equally applicable to forming a silicon oxide film which is deposited on a surface of any suitable semiconductor material, such as for example a semiconductor material selected from among Group III–V compounds, Group II–VI compounds, mixed crystals of III–V and II–VI compounds or Group IV elements of the Periodic Table of Elements as set forth in the Mendelyeev Periodic Table appearing on page B2 in the 45th edition of the "Handbook of Chemistry and Physcis," published by the Chemical Rubber Company.

With reference now to FIG. 1, there is shown apparatus for carrying out the method of the present invention. Apparatus 20 includes a generally cylindrical open-ended furnace 21 having a high-temperature liner tube 22. Furnace 21 and its liner tube 22 encircle a reaction tube 23 which is typically fabricated from quartz. Any temperature profile may be impressed on the interior of reaction tube 23 by selectively controlling a conventional heat source (not shown).

A thick wall tube 24, which serves as the exterior structural member of the waveguide, passes through the ends 26 and 27 of reaction tube 23 and is maintained therein by a conventional holding means (not shown). Since the intensity of light propagated by a waveguide can be made to be substantially zero within the exterior structural portion formed from tube 24, the material of tube 24 need not be of the high purity required of a light propagating core or cladding material. The material of tube 24 may be normally produced glass having an ordinary or even an excessive level of impurities or entrapping bubbles that would render it unsuitable for effective light propagation, however, it must have a viscosity and coefficient of expansion compatible with waveguide cladding and core materials destined to be deposited on the inside surface 28 thereof.

Tube 24 may be produced by core drilling a solid rod of material such as glass. The rough surfaces left by drilling may be smoothed by one or more methods such, for example, as laser milling the inside surface, mechanically polishing the inside surface, fire polishing the inside surface, washing the tube in hydrofluoric acid, or the like. A particularly suitable method of smoothing the inside wall of tube 24 comprises first mechanically polishing the rough surface left by core drilling and thereafter flame polishing the mechanically polished surface. Hydrofluoric acid washing of the surface before and after all polishing operations is desirable to avoid contamination.

Passing through end 27 and communicating with the interior 25 of reaction tube 23, is an inlet tube 29. Inlet tube 29 is affixed by conventional means (not shown) to an inert gas, e.g., argon, source. Passing through end 26 and communicating with the interior 25 of reaction tube 23 is a gas outlet tube 30.

In operation, after the inside surface of tube 24 is smooth, a first coating 31 of the glass ($SiO_2$) is applied thereto, which coating will ultimately comprise the cladding for an optical fiber. Coating 31 must therefore be of a uniform thickness. Additionally, coating 31 must be formed of a suitable optical quality $SiO_2$ having desired physical and optical qualities such as viscosity, coefficient of expansion, index of refraction and purity. Coating 31 is produced in the following manner. A gaseous oxidant, i.e., a gas capable of oxidizing $SiH_2Cl_2$ to $SiO_2$ at elevated temperatures, such as $O_2$, $CO_2$, $N_2O$, $H_2O$, etc., is combined with an inert carrier gas, e.g., He, A, $N_2$, $H_2$, etc., and gaseous dichlorosilane, $SiH_2Cl_2$, at room temperature (25° C) and is conducted into and through glass ($SiO_2$) tube 24. When the reactant gases, i.e., $SiH_2Cl_2$ and the oxidizing gas are introduced, an inert gas, e.g., argon, is passed through inlet tube 29 into reaction tube 23 in order to flush this tube. The inert gas passes through tube 23 and exits via gas outlet tube 30.

It is, of course, understood that the concentration of the dichlorosilane in the reaction gas mixture can be varied depending on the amount of $SiO_2$ desired to be formed and deposited as layer or coat 31. It is also, of course, understood that the concentration of the oxidizing gas, e.g., $H_2O$, $O_2$, $CO_2$, $N_2O$, contained along with the carrier gas, e.g., He, in the oxidizing gas mixture should be an amount sufficient to oxidize the dichlorosilane to obtain the desired amount of $SiO_2$. It is further to be pointed out and stressed that unlike other prior art techniques of forming $SiO_2$, e.g., from $SiCl_4$ or by thermal oxidation of Si, the reaction between $SiH_2Cl_2$ and the oxidizing gas, e.g., $O_2$, (1) can occur at lower temperatures, e.g., 450° C, (2) is rapid and (3) the rate thereof is substantially independent of the reaction temperature over a wide range of temperature, e.g., about 950° C to about 1100° C.

The temperature of furnace 21 and thus both reaction tube 23 and glass ($SiO_2$) tube 24 is maintained at a suitable temperature for reacting the dichlorosilane and the oxidizing gas, e.g., $O_2$, to form $SiO_2$ which is deposited on the inner surface 28 of tube 24 to form $SiO_2$ layer 31 which is destined to function as the cladding for the optical fiber. Typically, a suitable temperature is one ranging from as low as 750° C to 1200° C. Surprisingly, unlike prior art gaseous oxidizing techniques, employing $SiCl_4$ or thermal oxidation of silicon, elevated temperatures such as 1100°–1200° C are not necessary and the layer 31 can successfully be fabricated without defects, such as non-uniformities, at a temperature as low as 450° C. Also, surprisingly unlike techniques employing gaseous oxidation of $SiCl_4$ or $SiH_2$, the uniformity or thickness of layer 31 obtained by oxidizing $SiH_2Cl_2$ is not affected by variations in temperature (temperature gradients) along the length of tube 24.

The gaseous reaction mixture comprising in part the oxidizing gas, e.g., $O_2$, $CO_2$, $N_2O$, $H_2O$, etc., and dichlorosilane contacts the inner surface 28, maintained at a suitable temperature, and reacts thereat to form $SiO_2$, as illustrated in the equations below, which is deposited as layer 31.

1. $SiH_2Cl_2(g) + O_2(g) = SiO_2(s) + 2HCl(g)$

2. $SiH_2Cl_2(g) + 2H_2O(g) = SiO_2(s) + 2HCl(g) + 2H_2(g)$

3. $SiH_2Cl_2(g) + 2CO_2(g) = SiO_2(s) + 2HCl(g) + 2CO(g)$.

4. $SiH_2Cl_2(g) + 2N_2O(g) = SiO_2(s) + 2HCl(g) + 2N_2(g)$.

The reaction is carried out for a period of time sufficient to form layer 31 in a desired, uniform thickness.

It is to be noted that the $SiO_2$ (forming layer 31) can be doped with a dopant which changes, e.g., lowers, the index of refraction. One such typical dopant comprises $B_2H_6$. When such doping is desired, the dopant material, e.g., $B_2H_6$, is incorporated into the oxidizing reaction gas mixture.

Next, a layer 32, destined to form the core of the optical fiber is deposited on layer 31. The core of the optical waveguide should be produced from an optical quality glass ($SiO_2$) having a higher index of refraction, typically about 1%, than the cladding while having physical characteristics similar to the cladding. Accordingly, the same or similar type of glass ($SiO_2$) used for the cladding, i.e., layer 31, but doped with a small amount of some other material to slightly increase the index of refraction thereof is suitable for use as the core glass. Some typical suitable dopants are titanium oxide, tantalum oxide, tin oxide, niobium oxide, zirconium oxide, aluminum oxide, lanthanum oxide and germanium oxide. The amount of dopant used should be kept to a minimum for various reasons. First, since additional doping material would cause the index of refraction to increase, the difference between the index of refraction of the cladding glass and the core glass will also increase requiring a decrease in the allowable core diameter of the waveguide. Second, if an excessive amount of doping material is added to the base material, a loss in light transmission will result. Desirably, a small yet precise amount of dopant should be added to the base material for the primary purpose of changing the index of refraction. For the purposes of the present invention, the amount of dopant is preferably maintained below about 10% by weight of the total composition.

The doped $SiO_2$ layer 32 is formed in the same manner described above for layer 31 except that the oxidizing reaction gas mixture comprises in addition a quantity of a dopant material, e.g., $TiCl_4$, $GeCl_4$, etc.

It is to be noted that the doping to form layer 32 may be carried out whereby increasing quantities of the dopant are introduced over a period of time so that a gradual increase in the refractive index from layer 31 to layer 32 is obtained, i.e., a gradual refractive index gradient is obtained from a point within layer 31 and a point within layer 32.

Referring to FIG. 2, tube 24 having layers 31 and 32 deposited thereon, is removed and heated by a conventional means 33, e.g., a furnace, focused radiant energy, etc., until tube 24 and coating 31 and 32 reach a temperature at which the materials have a viscosity low enough for drawing. Tube 24 is then drawn until longitudinal hole 34 collapses, that is, the core glass of second coating 32 fills hole 34 to form a solid core 36 surrounded by cladding 31 which in turn is surrounded by thick wall tube 24. Thereafter, continued drawing of the resultant composite rod or preform 40 further reduces the diameter thereof to form a glass optical fiber which possesses the characteristics of a desired optical waveguide.

It is to be noted that alternatively, where a high purity, essentially defect-free quartz or $SiO_2$ tube 24 is employed, the formation of layer 31 may be eliminated and layer 32 may be directly deposited on surface 28 of tube 24.

Referring to FIG. 3, in an alternative embodiment, a glass ($SiO_2$) rod 41 may be employed instead of tube 24. Layer 32 (comprising suitably doped $SiO_2$) is first deposited on the outer surface 42 of rod 41. Layer 31 (having a lower index of refraction than layer 32) is then deposited on layer 32. Glass rod 41 may then be removed, e.g., by grinding with a diamond reamer, to form a desired optical fiber preform 43. Preform 43 may then be drawn to reduce its diameter to form the glass optical fiber.

Again, it is to be pointed out that if glass or SiO₂ rod 41 is sufficiently pure and defect free, layer 31 may be eliminated and only layer 32 may be deposited on surface 42.

Figure 4:
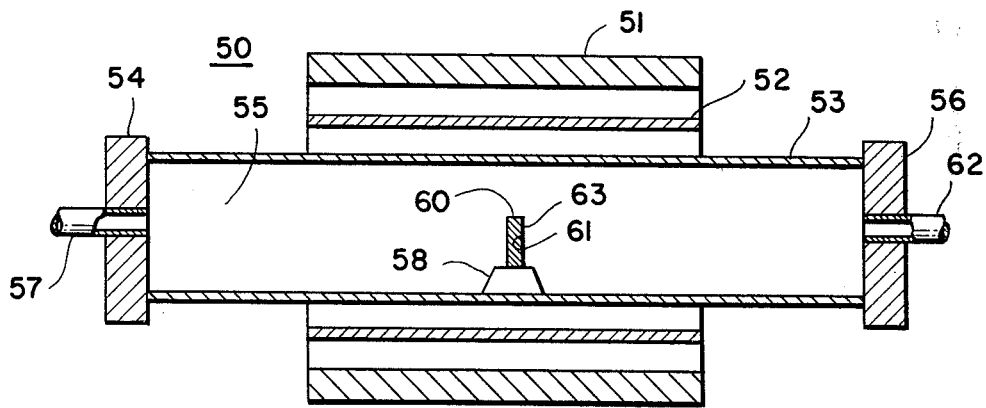
FIG. 4 is a cross-sectional view of a typical apparatus for reacting $SiH_2Cl_2$ with a gaseous oxidant to form $SiO_2$ which is deposited as a film on a surface of a semiconductor substrate maintained therein.

Referring now to FIG. 4, there is shown an apparatus 50 for depositing a SiO₂ film on a surface of a substrate comprising a semiconductor material. Apparatus 50 includes a generally cylindrical open-ended furnace 51 having a high-temperature liner tube 52, e.g., a mullite tube. Furnace 51 and its liner tube 52 encircle a reaction tube 53 which is typically fabricated from a refractory material, e.g., alumina, quartz, boron nitride, etc. Any temperature profile may be impressed on the interior 55 of reaction tube 53 by selectively controlling a conventional heat source (not shown).

The ends of reaction tube 53 are sealed by appropriate plugs or end caps 54 and 56. Plug 54 carries an exhaust port 57 which communicates through plug 54 with the interior 55 of reaction tube 53. Maintained within reaction tube 53, by means of a holder 58, is a semiconductor seed crystal or substrate 60, e.g., a single crystal silicon wafer. Holder 58 may comprise any standard holder or holding means known in the art which has the ability to maintain a face or surface 61 of semiconductor substrate 60 in a position whereby face 61 may be conveniently deposited with a layer comprising SiO₂ from the gaseous reaction mixture comprising in part the oxidizing gas, e.g., O₂, CO₂, N₂O, H₂O, etc. and dichlorosilane, to which it is destined to be exposed or contacted with.

Passing through plug 56 and communicating with interior 55 of reaction tube 53 is an inlet tube 62. Inlet tube 62 is affixed by conventional means (not shown) to a mixing chamber (not shown) containing the gaseous reaction mixture, i.e., $SiH_2Cl_2$, a gaseous oxidant capable of oxidizing $SiH_2Cl_2$ and the inert carrier gas such as He.

In operation, the gaseous oxidant, i.e., the gas capable of oxidizing $SiH_2Cl_2$ to SiO₂, such as O₂, CO₂, N₂O, H₂O, etc. is combined with the inert carrier gas, e.g., He, A, N₂, H₂, etc., and gaseous dichlorosilane $SiH_2Cl_2$, at room temperature (25° C) within the mixing chamber. The resultant gaseous reaction mixture is conducted from the mixing chamber through inlet tube 62 into reaction tube 53 whereby surface 61 of semiconductor substrate 60 is exposed thereto at an elevated temperature, e.g., 900° C, and deposited with a uniform film or layer 63 comprising SiO₂. The reaction mixture then exits via gas outlet tube 57. Alternatively, the oxidant gas may also be introduced separately through a separate inlet tube (not shown), in a manner well known in the art.

It is of course understood that the concentration of the dichlorosilane in the reaction gas mixture can be varied depending upon the amount of SiO₂ desired to be formed and deposited as film or layer 63. It is also again understood that the concentration of the oxidizing gas, e.g., H₂O, O₂, CO₂, contained along with the carrier gas, e.g., He, in the oxidizing gas mixture should be an amount sufficient to oxidize the dichlorosilane to obtain the desired amount of SiO₂.

The temperature of furnace 51 and thus both reaction tube 53 and substrate 60 is maintained at a suitable temperature for reacting the dichlorosilane and the oxidizing gas, e.g., O₂, to form SiO₂ which is deposited on surface 61 of semiconductor substrate 60 to form SiO₂ layer 63. Layer 63 is destined to function as a masking or insulating layer in the formation of a planar semiconductor device. Typically, a suitable temperature is one ranging from as low as 450° C to 1200° C. A preferred temperature for a single crystal silicon substrate, however, is one not exceeding 900° C. Above 900° C, stacking faults and other defects are introduced into the single crystal silicon substrate. Surprisingly, unlike prior art gaseous oxidizing techniques of forming a SiO₂ film on a semiconductor surface, e.g., employing $SiCl_4$ or thermal oxidation of silicon, the reaction between $SiH_2Cl_2$ and the oxidizing gas, e.g., O₂, occurs at a relatively rapid rate at relatively low temperature such as at 700° C whereby introduction of relatively fewer faults and defects into semiconductor substrate 60 can result. Therefore elevated temperatures such as 1100°–1200° C are not necessary and layer 63 can successfully be fabricated with the introduction of a minimum of defects at a low temperature, such as 450° C, at a rate which is economically practical. Also, surprisingly, unlike techniques employing gaseous oxidation of $SiCl_4$ or $SiH_4$, the rate of formation of SiO₂ from oxidizing $SiH_2Cl_2$ is substantially independent of the reaction temperature over a wide temperature range and thus the thickness and uniformity of layer 63 obtained by oxidizing $SiH_2Cl_2$ is not affected by variations in temperature (temperature gradients). This is very important since substrate 60 is typically a large silicon slice from which individual units are destined to be subdivided. Accordingly, substrate 60 should be deposited with a SiO₂ layer 60 which is uniform both in composition and thickness.

The gaseous reaction mixture comprising in part the oxidizing gas, e.g., O₂, CO₂, N₂O, H₂O, etc., and dichlorosilane contacts surface 61, maintained at a suitable temperature, and reacts thereat to form SiO₂, as illustrated in equations (1), (2), (3), and (4) above. The reaction is carried out for a period of time sufficient to form layer 63 in a desired thickness.

The above-described method of forming SiO₂ layer 63 is useful in the fabrication of planar semiconductor devices. Referring now to FIGS. 5A–5H, there is shown for illustrative purposes only a double diffused transistor at various stages of manufacture. It is to be pointed out that the inventive concept described herein is not limited to the particular semiconductor device described but is applicable to forming any semiconductor device whereby a SiO₂ layer is employed.

Figure 5:
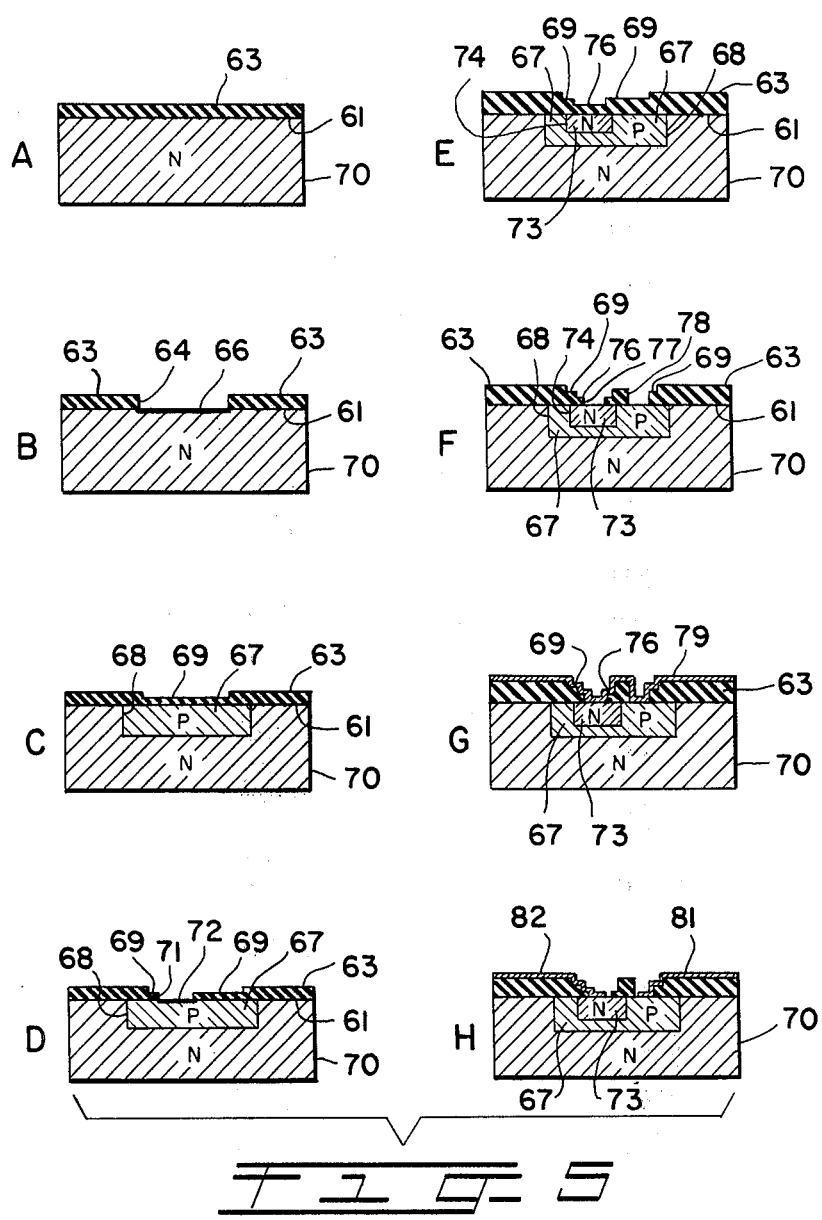
FIGS. 5A-5H are sectional elevations through a semiconductor body illustrating various stages of fabrication thereof according to the invention.

As illustrated in FIG. 5A, a semiconductor substrate 70 is formed of semiconducting silicon material having a first conductivity type, i.e., semiconductor body 70 contains either an N or a P-type impurity. For purposes of the illustration of the method and as shown in the figures, substrate 70 contains an N-type impurity. Substrate 70 has formed thereon insulating layer 63 entirely covering the upper surface 61 of semiconductor body 70. Insulating layer 63, comprising SiO₂, is typically 1500 to 3500 Angstroms thick and is formed in the manner described above by reacting $SiH_2Cl_2$ with a gaseous oxidant such as O₂ at surface 61 of substrate 60. Substrate 70 is then obtained by subdividing substrate 60 into individual units employing conventional techniques. Such a subdivision procedure is carried out since processing of the larger substrate or slice 60 is both more convenient and less costly.

The next step comprises the selective removal of a portion of silicon oxide layer 63 to expose a desired portion of the surface 61 of semiconductor substrate 70 so that the oxide coating can function as a diffusion mask as indicated in FIG. 5B. The selective removal is accomplished using conventional lithographic techniques employing selective photoresist masking and subsequent etching in a suitable etching solution, e.g., a buffered hydrofluoric acid solution, whereby an opening indicated by the reference numeral 64 is formed in oxide layer 63. After forming hole or aperture 64, the next step in the manufacture of the semiconductor device is to deposit a desired impurity on the exposed portion of surface 61, i.e., the portion of surface 61 within aperture 64. This step of depositing a desired impurity on the surface of a semiconductor body under controlled temperature conditions whereby the impurity does not diffuse significantly into the body but rather forms surface compounds therewith is usually referred to in the art as "predeposition." With an N-type silicon body, the impurity predeposited on the surface of substrate 70, and indicated by the reference numeral 66, would be one of the known acceptor impurities, usually a Group III element. The predeposition, as indicated in FIG. 5B, may preferably be carried out in an inert atmosphere whereby substantially no oxidation of the surface 61 within aperture 64 occurs, or may be carried out in an oxidizing atmosphere whereby a thin layer of silicon oxide will be formed on the exposed portion of surface 61.

The next step in the method is the diffusion of the predeposited impurity 66 into substrate 70 by conventional solid state diffusion techniques. This is carried out by applying sufficient heat to substrate 70 to raise the temperature thereof to a temperature where diffusion takes place at an appreciable rate, e.g., typically 900° C. The diffusion of the impurity into substrate 70 produces a region 67 (FIG. 5C) of P-type silicon therein and results in the production of a P-N junction 68 which extends to surface 61. A fresh layer of silicon oxide, indicated generally by the numeral 69 is then formed at a relatively low temperature, e.g., not exceeding 900° C, by reacting $SiH_2Cl_2$ with a gaseous oxidant, as described above. The fresh layer of silicon oxide 69 is grown on the portion of surface 61 of region 67 whereby a continuous layer of oxide is again present on surface 61.

The predeposition procedure is well known in the art and will not be elaborated herein. It is to be noted hereat, however, that the deposition of the desired impurity and the diffusion thereof may be carried out in a single step whereby the surface of substrate 70 is exposed to a gaseous impurity at an elevated temperature, i.e., a diffusion temperature, e.g., 900° C.

The next step in the production of the double diffused planar transistor is the selective removal of a portion of fresh oxide layer 69 to expose a portion of surface 61 above region 67 for the purpose of diffusing another impurity into region 67. In order to expose the desired portion of surface 61 above region 67, an aperture 71 (FIG. 5D) is formed in a portion of fresh oxide layer 69 by standard photoresist and etching processes (lithographic processes) as employed with aperture 64.

Following the formation of aperture 71, a desired impurity indicated generally by the reference numeral 72 in FIG. 5D is deposited on the exposed portion of surface 61 in a similar manner used for depositing impurity 66. Impurity 72 may be any of the known donor impurities, for example, an element from Group V of the periodic table.

As shown in FIG. 5E, substrate 70 is then again subjected to an increased temperature to cause the impurity 72 to be diffused into region 67 to produce an N-type region 73 and a planar P-N junction 74. The planar double diffused transistor is now essentially complete, except for contacts to the various electrodes or regions of the semiconductor material, with substrate 70 corresponding to the collector and regions 67 and 73 corresponding, respectively, to the base and the emitter of the transistor.

Also as indicated in FIG. 5E, a fresh oxide portion 76 is again formed, as by a low-temperature reaction, e.g., at 900° C, between $SiH_2Cl_2$ and a gaseous oxidant, as described above, on the portion of surface 61 over region 73.

In order to complete the transistor structure, electrical leads or conductors must be ohmically connected to the base, emitter, and collector regions. As shown in FIG. 5F, a pair of openings 77 and 78 are formed by conventional photomasking techniques in the oxide layer to expose a portion of the surface 61 over regions 73 and 67 respectively, and then a layer of metal 79 (FIG. 5G) is deposited by any of the well-known techniques in the art over the entire exposed surface areas including remaining oxide layer 63, remaining oxide portions 69, 76, and the exposed surfaces of regions 67 and 73, to which it makes ohmic electrical contact. Following the deposition of metal film 79, undesired portions thereof are removed, again using conventional photolithograhic techniques to produce a pair of contacts 81 and 82 connected to the regions 67 and 73 respectively (FIG. 5H). An electrical connection (not shown) for the collector region, i.e., the N-type body, may be provided by means of a metal layer on the bottom surface of substrate 70 or by opening another aperture in the oxide layer using any conventional technique known in the art.

In an alternative embodiment, in order to insure the uniformity of oxide layers which result, the oxide masking layers in the above-described process are removed subsequent to the impurity predepositing step and prior to the impurity diffusion step. Such removal or stripping is accomplished by using a suitable etchant such as hydrofluoric acid. A uniform oxide layer is then formed after each diffusion step is carried out by reacting $SiH_2Cl_2$ with a gaseous oxidant, as described above. This procedure is generally described, except for the formation of $SiO_2$ by reacting $SiH_2Cl_2$, in U.S. Pat. No. 3,404,451 which is incorporated hereinto by reference.

Specific examples of the subject invention are as follows:

EXAMPLE I

To illustrate the relative rates of reaction between $SiH_4$ and $SiH_2Cl_2$ in the formation of $SiO_2$ the following was performed:

A. Referring to FIG. 1, a reaction mixture, comprising $4.5 \times 10^{-2}$ atmospheres of $O_2$, $3 \times 10^{-3}$ atmospheres of $SiH_4$, $3 \times 10^{-4}$ atmospheres of $B_2H_6$ and a remainder of He to make a total of one atmosphere of the gaseous mixture having a flow rate of 1000 cc/min., was introduced at 1100° C into a high purity quartz tube 24, having a thickness of 1.5 mm and an internal diameter of 2 mm, maintained in reaction tube 23. Reaction tube 23 was maintained at a temperature of 1100° C whereat the $SiH_4$ was oxidized to $SiO_2$, with boron doping, which was deposited on the inner surface 28 of tube 24 at a rate of 4.26 $\mu$m/hr. to form a 0.4 mil thick film 31 along the middle section of tube 24.

B. The procedure of Example I-A was repeated except that $3 \times 10^{-3}$ atmospheres of $SiH_2Cl_2$ instead of $SiH_4$ and $9 \times 10^{-2}$ atmospheres of $O_2$ was employed. A $SiO_2$ deposition rate of $12.7 \mu m/hr$. was obtained as well as a 0.5 mil thick boron-doped $SiO_2$ film 31.

EXAMPLE II

To illustrate the relative temperature independence of forming the fiber optic preform by the subject invention, whereby uniform deposition along the length of the deposited tube is attained, the following was performed. The procedure of Example I-B was repeated except that the reaction mixture comprised about $7.5 \times 10^{-3}$ atmospheres of $O_2$ about $2.5 \times 10^{-4}$ atmospheres of $SiH_2Cl_2$, and a remainder of He to make a total of one atmosphere of the gaseous reaction mixture having a flow rate of 1000 cc/min. The reaction mixture was introduced into tube 24, maintained at 1100° C, to deposit a clear $SiO_2$ film 31 at a rate of $3.13 \mu m/hr$. There was a flat temperature zone (1100° C) within furnace 21 (FIG. 1) of about 6 inches in length. The resultant clear $SiO_2$ film-deposited tube 24 was removed from furnace 21 and cross-sectioned every 1.5 inches along the length which had been situated within the 6 inch flat temperature (1100° C) zone of the furnace. Interferometric photographs were then taken of the cross sections and the thickness of the clear $SiO_2$ film 31 was calculated therefrom. The following thicknesses were obtained: 0.75 mils (inlet end), 0.62 mils, 0.50 mils, 0.50 mils and 0.50 mils (exhaust end). Therefore, minor temperature gradients within tube 24 have almost no effect on the uniformity of the $SiO_2$ deposit.

EXAMPLE III

To illustrate the relative temperature independence of forming the fiber-optic preform by the subject invention, the following were performed:

A. The procedure of Example I-B was repeated except that the reaction gas mixtre comprised $7.5 \times 10^{-3}$ atmospheres of $O_2$, $2.5 \times 10^{-4}$ atmospheres of $SiH_2Cl_2$, and a remainder of He to make a total of one atmosphere of the gaseous reaction mixture having a flow rate of 1000 cc/min., which was introduced and reacted at 950° C within the tube 24. A clear $SiO_2$ deposit (0.30 mil thick) forming layer 31 (FIG. 1) was obtained. The rate of deposit or growth was $2.17 \mu m/hr$.

B. The procedure of Example III-A was repeated except that the reaction temperature was 1025° C. A 0.30 mil thick clear $SiO_2$ deposit or layer 31 was obtained. The rate of deposition or growth was $3.05 \mu m/hr$.

C. The procedure of Example III-A was repeated except that the reaction temperature was 1050° C. A 0.40 mil thick clear $SiO_2$ layer 31 was obtained. The rate of deposition or growth was $2.90 \mu m/hr$.

D. The procedure of Example III-A was repeated except that the reaction temperature was 1075° C. A 0.42 mil thick clear $SiO_2$ layer 31 was obtained. The rate of growth was $3.556 \mu m/hr$.

Figure 6:
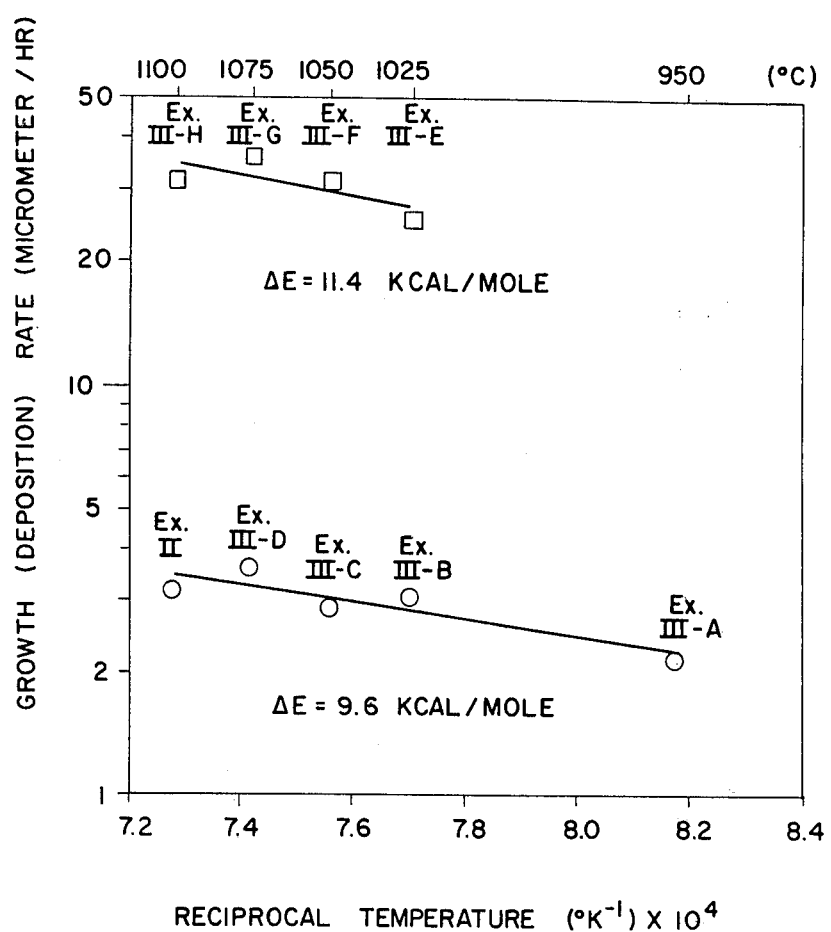
FIG. 6 is a graphical representation of the rate of growth of $SiO_2$ with temperature resulting from reacting $SiH_2Cl_2$ and $O_2$.
Figure 7:
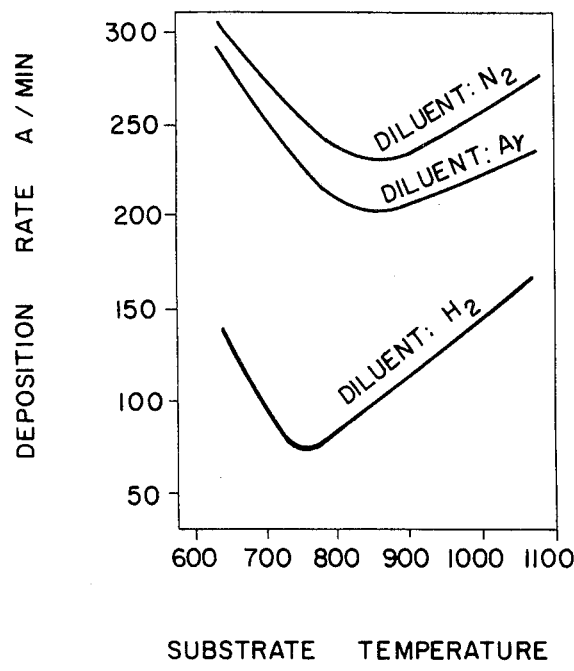
FIG. 7 is a graphical representation of the rate of growth of $SiO_2$ with temperature resulting from reacting $SiH_2$ and $O_2$.

The temperature dependence of Examples II and III-A to III-D are illustrated in FIG. 6. As indicated, within experimental error, the $SiO_2$ growth or deposition rate is substantially independent of temperature (950°–1100° C) which is a surprising and unexpected result, especially in the light of the prior art results employing $SiH_4$ and $SiCl_4$ as indicated in FIG. 7 [Chu et al., *Transactions of the Metallurgical Society of AIME*, Vol. 242, 532 (Mar. 1968)], FIG. 8 [Tung et al., *Transactions of the Metallurgical Society of AIME*, Vol. 233, 572 (Mar. 1965)] and FIG. 9 [Steinmaier et al., *J. Electrochemical Soc.*, Vol. III, No. 2, pg. 206 (Feb. 1964)].

Figure 8:
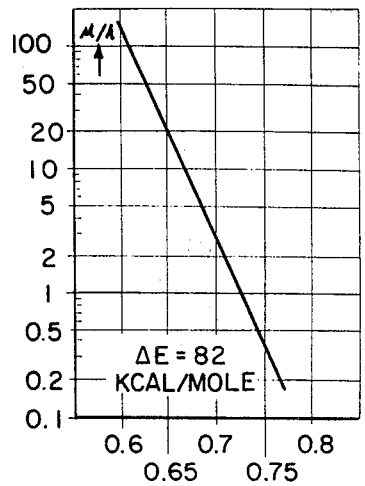
FIG. 8 is a graphical representation of the rate of growth of $SiO_2$ with temperature resulting from reacting $SiCl_4$ and $CO_2$.
Figure 9:
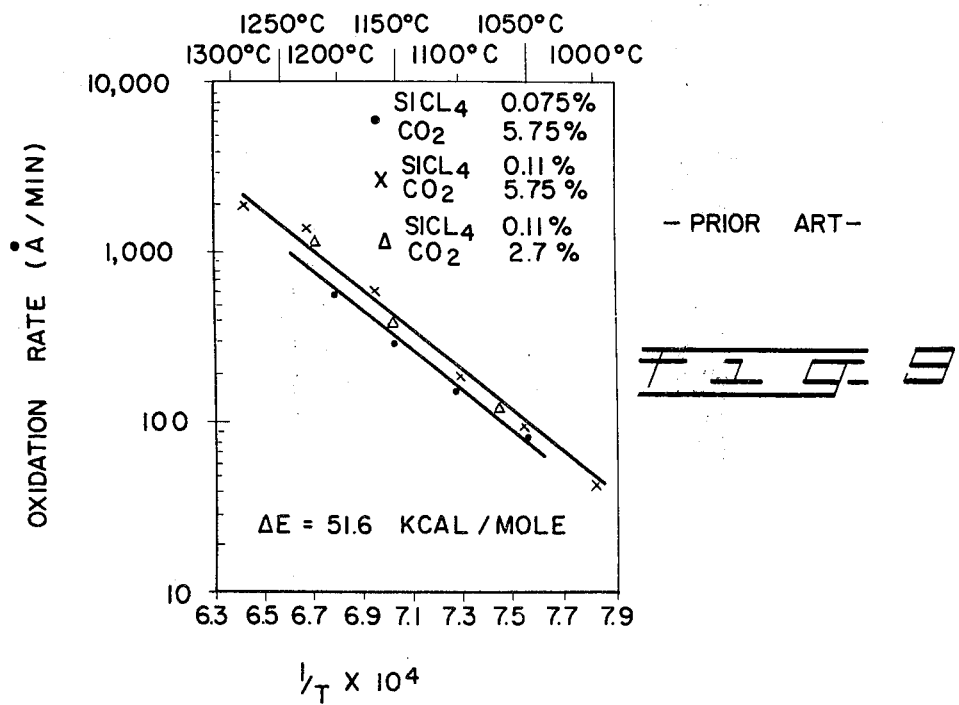
FIG. 9 is a graphical representation of the rate of growth of $SiO_2$ with temperature resulting from reacting $SiCl_4$ and $CO_2$.

Another indication of the temperature independence of the rate is illustrated by the low activation energy of 9.6 kcal/mole (FIG. 6) which compares most favorably to the high activation energy, obtained with the prior art process for $SiCl_4 + CO_2$, of 51.6 to 82 kcal/mole (FIGS. 8 and 9).

E. The procedure of Example III-A was repeated except that the reaction gas mixture comprised $4.5 \times 10^{-2}$ atmospheres of $O_2$, $1.5 \times 10^{-3}$ atmospheres of $SiH_2Cl_2$, and a remainder of He to make a total of one atmosphere of the gaseous reaction mixture having a flow rate of 1000cc/min. The reaction temperature was 1025° C. A 1.0 mil thick $SiO_2$ layer 31 was obtained. The rate of growth was $25.4 \mu m/hr$.

F. The procedure of Example III-E was repeated except that the reaction temperature was 1050° C. A 1.25 mil thick layer 31 was obtained. The deposition or growth rate was $31.75 \mu m/hr$.

G. The procedure of Example III-E was repeated except that the reaction temperature was 1075° C. About a 2.0 mil to 2.25 mil thick layer 31 was obtained. The deposition or growth rate averaged about $36 \mu m/hr$.

H. The procedure of Example III-E was repeated except that the reaction temperature was 1100° C. A 2 to 3 mil thick layer 31 was obtained. The deposition or growth rate averaged about $31.75 \mu m/hr$.

The temperature dependence of Examples III-E to III-H are illustrated in FIG. 6. As indicated, within experimental error, the $SiO_2$ deposition or growth rate is substantially independent of temperature (1025°–1110° C) which is a surprising and unexpected result, especially in the light of the prior art results illustrated in FIGS. 7, 8 and 9.

Another indication of the temperature independence of the rate is illustrated by the low activation energy of 11.4 kcal/mole (FIG 6) which compares most favorably to the high activation energy, obtained with the prior art process for $SiCl_4 + CO_2$, of 51.6 to 82 kcal/mole (FIGS. 8 and 9).

EXAMPLE IV

The procedure of Example I-B was repeated except that the reaction mixture comprised $4.5 \times 10^{-2}$ atmospheres of $O_2$, $1.5 \times 10^{-3}$ atmospheres of $SiH_2Cl_2$, $1.5 \times 10^{-4}$ atmospheres of $B_2H_6$ dopant and a remainder of He to make a total of one atmosphere of the gaseous reaction mixture having a flow rate of 1000 cc/min., which was introduced and reacted at 1100° C within tube 24. A clear, boron-doped $SiO_2$ deposit (13.0 mils thick) was obtained after 390 minutes forming layer 31. The resulting deposited tube 24 was removed from the reaction tube 23 (FIG. 1) and a commercially obtained, high purity fused silica tube was inserted in deposited tube 24. The resultant composite structure was collapsed in a vacuum at an elevated temperature to make a 5 mm. diameter optical fiber preform. The resultant preform was heated by means of a focused radiant energy system and then drawn into a fiber having a diameter of 8 mils and a length of 18 meters. An optical loss measurement was then taken on the fiber using a conventional technique. The 6328 A. He-He laser line wave guiding loss in the fiber was as low as 14 decibels/Km and averaging about 64 decibels/km.

EXAMPLE V

A. Referring to FIG. 4, a gaseous reaction mixture comprising $1.8 \times 10^{-4}$ atmospheres of $SiH_2Cl_2$, $1.08 \times 10^{-2}$ atmospheres of oxygen and a remainder of nitrogen, to make a total of one atmosphere of the gaseous reaction mixture, having a flow rate of 3000 cc/min., was introduced into reaction tube 53. Maintained at a temperature of 900° C within the reaction tube 53 was a semiconductor chip 60 comprising single crystal silicon. The gaseous mixture was reacted at the (100) surface 61 of silicon chip 60 to form $SiO_2$ which was deposited on surface 61 at a rate of about 100A./min to form layer or film 63. This rate of deposition is much greater than that reported for both the dry oxidation of silicon and the wet oxidation of silicon which is about 1 A./min. and about 19 A./min. at 900° C, respectively (as calculated from the rates reported in A. G. Revesz and R. J. Evans, *J. Phys. Chem. Solids*, Vol. 30, 551 [1969]; and W. A. Pliskin, *IBM J. Res. Dev.* Vol. 10, 198 [1966], respectively).

The resultant oxide layer 63 which was about 5000A. thick was then etched at 25° C with an aqueous etching solution comprising 90.8 cc of 49 weight percent HF, 276.8 grams of $NH_4F$, and 378 cc of $H_2O$. The etch rate was about 4000A./min.

B. The procedure of Example V-A was repeated except that helium was used instead of nitrogen. $SiO_2$ was deposited on surface 61 at a rate of about 220 A./min. The etch rate was about 4000 A./min.

EXAMPLE VI

The procedures of Examples V-A and V-B were repeated with a plurality of chips 60 maintained at a temperature ranging from 450° C to 1100° C. The rates of $SiO_2$ growth on surface 61 were measured as a function of temperature as illustrated in FIG. 10. Within experimental error, the $SiO_2$ growth or deposition rate is substantially independent of temperature. This is illustrated by the low activation energy of about 10 kcal/mole which compares most favorably with the high activation energy obtained with the prior art process for $SiCl_4 + CO_2$, of 51.6 to 82 kcal/mole (FIGS. 8 and 9).

EXAMPLE VII

Figure 11:
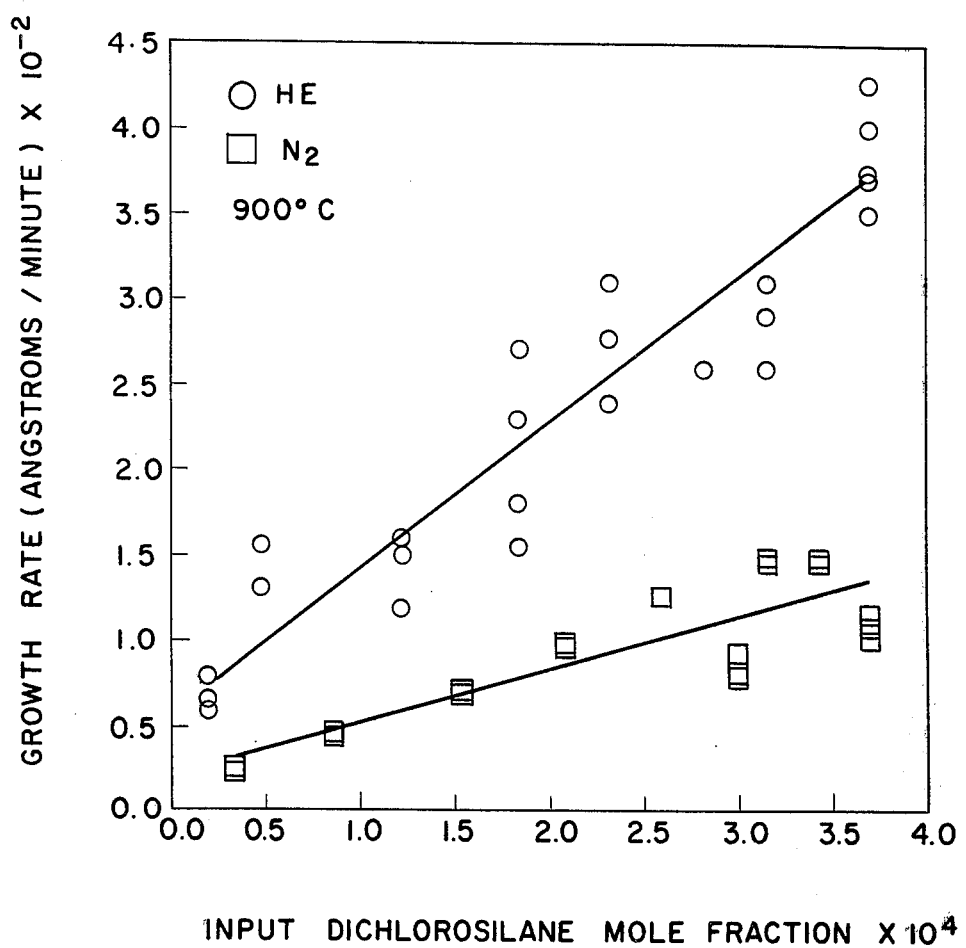
FIG. 11 is a graphical representation of the rate of growth of $SiO_2$ on a (100) silicon surface with the mole fraction of $SiH_2Cl_2$.

The procedures of Examples V-A and V-B were repeated except that various mole fractions of dichlorosilane were employed. The growth rate of the resultant SiO layer 63 was measured as a function of the mole fraction of SiH Cl as illustrated in FIG. 11.

It is to be understood that the above-described embodiments are simply illustrative of the principles of the invention. Various other modifications and changes may be made by those skilled in the art which will embody the principles of the invention and fall within the spirit and scope thereof.

What is claimed is:

1. A method of depositing a glass layer comprising $SiO_2$ on a surface of a substrate which comprises initially combining gaseous $SiH_2Cl_2$ with an oxidizing gas, selected from the group consisting of $O_2$, $CO_2$, $N_2O$, $H_2O$ and mixtures thereof in a liquid phase free ambient at a temperature ranging from about 450° C to about 1200° C to directly form and deposit $SiO_2$ on the substrate surface at a rate which is substantially temperature independent.

2. In a method of forming an optical waveguide preform comprising:
   a. providing a glass cylindrical member having a first index of refraction; and
   b. depositing a glass layer comprising $SiO_2$ on a surface of the glass cylindrical member, the $SiO_2$ glass layer having a second index of refraction, wherein the improvement comprises:
   in step (b) initially combining and reacting gaseous $SiH_2Cl_2$ and a gaseous oxidant, selected from the group consisting of $O_2$, $CO_2N_2O$, $H_2O$ and mixtures thereof, in a liquid phase free ambient at a temperature ranging from about 450° C to about 1200° C to directly form a uniform $SiO_2$ layer at a rate which is substantially temperature independent.

3. In an improved method of forming a clad optical fiber comprising:
   a. providing a glass tube having a first index of refraction;
   b. depositing a $SiO_2$ glass layer on a surface of the glass tube, and $SiO_2$ glass layer having a second index of refraction;
   c. heating the structure so formed to the drawing temperature of the materials thereof; and
   d. drawing the heated structure to reduce the cross-sectional area thereof and to collapse the $SiO_2$ deposited glass tube to form the core of the fiber and the cladding of the fiber, wherein the improvement comprises:
   in step (b), combining and reacting a gaseous mixture comprising at least $SiH_2Cl_2$ and a gaseous oxidizing agent, selected from the group consisting of $O_2$, $CO_2$, $N_2O$, $H_2O$ and mixtures thereof, in a liquid phase free ambient at a temperature ranging from about 450° C to about 1200° C to directly form and deposit a uniform $SiO_2$ layer on the surface at a rate which is substantially temperature independent.

4. In an improved method of forming a clad optical fiber comprising:
   providing a substantially cylindrical starting member;
   applying a first coating of $SiO_2$ to the outside peripheral surface of the member;
   applying a second coating of $SiO_2$ over the outside peripheral surface of the first coating, the second coating having an index of refraction less than that of the first coating;
   removing the cylindrical starting member;
   heating the structure so formed to the drawing temperature of the materials thereof; and
   drawing the heated structure to reduce the cross-sectional area thereof and to collapse the first coating of $SiO_2$ to form the core of the fiber and the second coating forming the fiber cladding, wherein the improvement comprises:
   initially forming and reacting a gaseous mixture comprising at least $SiH_2Cl_2$ and a gaseous oxidant, selected from the group consisting of $O_2$, $CO_2$, $N_2O$, $H_2O$ and mixtures thereof, in a liquid phase free ambient at a temperature ranging from about 450° C to about 1200° C to directly form a uniform $SiO_2$ glass coating at a rate which is substantially temperature independent.

5. A method of forming a structure having at least two portions with a different index of refraction, which comprises:
   initially combining and reacting a gaseous mixture comprising at least $SiH_2Cl_2$ and a gaseous oxidant, selected from the group consisting of $O_2$, $CO_2$, N₂O, H₂O and mixtures thereof, in a liquid phase free ambient at a temperature ranging from about 450° C to about 1200° C to directly form SiO₂ glass at a rate which is substantially temperature independent; and depositing said SiO₂ glass on a surface of a substrate, having a first index of refraction, to form a SiO₂ glass deposit having a second index of refraction.

6. The method as defined in claim 5 wherein said SiO₂ deposit is exposed to a reaction mixture which comprises said SiH₂Cl₂, said gaseous oxidant, and a suitable dopant, whereby second SiO₂ deposit is formed thereon having a third index of refraction.

7. The method as defined in claim 1 wherein the substrate comprises a semiconductor material.

8. The method as defined in claim 7 wherein said semiconductor material comprises silicon.

9. A method of forming a masking layer on a surface of a semiconductor body at a substantially temperature independent rate which comprises initially exposing the surface, at a temperature ranging from about 450° C to 1200° C, to a gaseous reaction mixture comprising SiH₂Cl₂ and an oxidant therefor, selected from the group consisting of O₂, CO₂, N₂O, H₂O and mixtures thereof, in a liquid phase free ambient to directly form the masking layer comprising SiO₂.

10. The method as defined in claim 9 wherein said semiconductor body comprises silicon.

11. The method as defined in claim 10 wherein said temperature ranges up to 900° C.

12. A method of treating a semiconductive wafer which comprises:
a. initially exposing in a liquid phase free ambient a surface of the wafer maintained at a temperature ranging from about 450° C to 1200° C to a reaction mixture comprising gaseous SiH₂Cl₂ and an oxidizing gas, selected from the group consisting of O₂, CO₂, N₂O, H₂O and mixtures thereof, to directly deposit a surface film comprising SiO₂ thereon at a substantially temperature independent rate;
b. selectively treating said deposited surface to remove a portion of said film therefrom to expose an underlying surface area; and
c. treating said underlying surface area with a conductivity type determining impurity to diffuse said impurity in a region of the semiconductive wafer underlying said underlying surface area.

13. The method as defined in claim 12 wherein said wafer comprises silicon.

14. The method as defined in claim 13 wherein said temperature ranges from 450° C up to 900° C.

15. In a method of forming a planar semiconductor device which comprises the steps of:
a. forming an oxide coating on a surface of a semiconductor body;
b. removing a selected portion of the oxide coating to expose the surface of the semiconductor body;
c. treating the exposed surface to controllably diffuse a selected impurity into the semiconductor body; and
d. reforming a continuous oxide coating on the surface of the body, wherein the improvement comprises;
in at least step (a) directly formina a unifrom SiO₂ coating on the surface at a substantially temperature independent rate by initially exposing the surface maintained at a temperature ranging from between 450° C to 1200° C, to a mixture comprising gaseous SiH₂Cl₂ and an oxidizing gas, selected from the group consisting of O₂, CO₂, N₂O, H₂O and mixtures thereof, in a liquid phase free ambient.

16. The method as defined in claim 15 wherein said semiconductor body comprises silicon.

17. The method as defined in claim 16 wherein said temperature ranges up to 900° C.

18. In a method of fabricating planar semiconductor devices which comprises the steps of:
a. forming an oxide layer on a surface of a semiconductor body of a first conductivity type;
b. forming an opening in the oxide layer to expose the surface of the semiconductor body;
c. predepositing a first selected impurity on the exposed surface;
d. controllably diffusing at an elevated temperature the first impurity into the semiconductor body to form a P-N junction extending to the surface;
e. reforming a continuous layer of oxide on the surface;
f. forming a second opening in a portion of the reformed oxide above the region of the semiconductor body into which the first impurity has been diffused to expose the surface;
g. predepositing a second selected impurity on the exposed surface;
h. diffusing at an elevated temperature the second selected impurity into the semiconductor body to form a second P-N junction between the first mentioned P-N junction and the surface; and
i. reforming a continuous layer of oxide on the surface, wherein the improvement comprises:
in at least step (a) directly forming a uniform SiO₂ layer on the surface at a substantially temperature independent rate by initially exposing the surface, at a temperature ranging from 450° C to 1200° C, to a mixture comprising gaseous SiH₂Cl₂ and an oxidizing gas, selected from the group consisting of O₂, CO₂, N₂O, H₂O and mixtures thereof, in a liquid phase free ambient.

19. The method as defined in claim 18 wherein said semiconductor body comprises silicon.

20. The method as defined in claim 19 wherein said temperature ranges up to 900° C.

21. In a method of fabricating a planar junction semiconductor device which comprises the steps of:
a. forming an oxide layer on a surface of a semiconductor body;
b. opening a hole in the oxide layer to expose a desired limited portion of the surface of the semiconductor body;
c. predepositing a first selected impurity on the exposed portion of the surface;
d. diffusing the first impurity into the semiconductor body to form a P-N junction which extends to the surface;
e. forming a continuous layer of oxide on the surface;
f. opening a hole in the oxide layer above the region of the semiconductor body into which the first impurity has been diffused to expose the surface;
g. predepositing a second impurity on the exposed surface;
h. diffusing the second impurity into the semiconductor body to form a second P-N junction between the first P-N junction and the surface;
i. reforming a continuous layer of oxide on the surface;

j. opening a plurality of holes in the oxide layers to expose a portion of each of the regions of the body containing the diffused impurities;

k. depositing a layer of metal on the surface of the oxide layers which fills the plurality of openings and makes ohmic contact with the exposed surface of each of the regions; and l. selectively removing portions of the metal layer to provide separate conductive paths to each of the regions, wherein the improvement comprises: in at least step (a) directly forming a uniform $SiO_2$ layer on the surface at a substantially temperature independent rate by initially exposing the surface, at a temperature ranging from 450° C to 1200° C, to a gaseous mixture comprising $SiH_2Cl_2$ and an oxidant therefor, selected from the group consisting of $O_2$, $CO_2$, $N_2O$, $H_2O$ and mixtures thereof, in a liquid phase free ambient.

22. The method as defined in claim 21 wherein said semiconductor body comprises silicon.

23. The method as defined in claim 21 wherein said temperature ranges up to 900° C.

* * * * *

UNITED STATES PATENT OFFICE
CERTIFICATE OF CORRECTION

Patent No. 4,002,512      Dated January 11, 1977

Inventor(s) Mahn-Jick Lim

It is certified that error appears in the above-identified patent and that said Letters Patent are hereby corrected as shown below:

In the specification, Column 1, line 24, "trasmit" should read --transmit--. Column 7, line 58, "$CO_2$, contained" should read --$CO_2$, $N_2O$, contained--. Column 8, line 29, "layer 60" should read --layer 63--. Column 9, line 43, "predeposition" should read -- "predeposition" --. Column 12, line 68, "km" should read --Km-- (second occurrence). Column 13, line 51, "SiO" should read --$SiO_2$--; line 52, "SiH Cl" should read --$SiH_2Cl_2$--.

In the claims, Column 14, claim 2, line 11, "$O_2$, $CO_2N_2O$, $H_2O$" should read --$O_2$, $CO_2$, $N_2O$, $H_2O$--; claim 3, line 21, "and $SiO_2$" should read --the $SiO_2$--. Column 15, claim 15, lines 62 and 63, "comprises;" should read --comprises:--; line 64, "formina a unifrom" should read --forming a uniform--.

Signed and Sealed this

Twenty-sixth Day of April 1977

[SEAL]

Attest:

RUTH C. MASON
Attesting Officer

C. MARSHALL DANN
Commissioner of Patents and Trademarks